United States Patent [19]
Jin et al.

[11] Patent Number: 5,146,152
[45] Date of Patent: Sep. 8, 1992

[54] CIRCUIT FOR GENERATING INTERNAL SUPPLY VOLTAGE

[75] Inventors: Tae-Je Jin; Joon-Young Jeon, both of Seoul, Rep. of Korea

[73] Assignee: SamSung Electronics Co., Ltd., Rep. of Korea

[21] Appl. No.: 724,796

[22] Filed: Jul. 2, 1991

[30] Foreign Application Priority Data

Jun. 12, 1991 [KR] Rep. of Korea .................. 1991-9659

[51] Int. Cl.$^5$ ........................... G05F 1/56; G05F 3/20
[52] U.S. Cl. ..................... 323/280; 323/281; 323/314; 323/907
[58] Field of Search ............... 323/274, 275, 280, 281, 323/313, 314, 907

[56] References Cited

U.S. PATENT DOCUMENTS

| | | | |
|---|---|---|---|
| 4,095,164 | 6/1978 | Ahmed | 323/280 |
| 4,398,833 | 6/1983 | Tzeng | 323/280 |
| 4,797,577 | 1/1989 | Hing | 323/907 |
| 4,868,483 | 9/1989 | Tsujimoto | 323/281 |

FOREIGN PATENT DOCUMENTS

0744513 7/1980 U.S.S.R. .................. 323/281

*Primary Examiner*—Peter S. Wong
*Attorney, Agent, or Firm*—Robert E. Bushnell

[57] ABSTRACT

An internal supply voltage generator receiving an external supply voltage, generates a stable, constant internal supply voltage to be applied to a semiconductor memory device regardless of the variation of the temperature. For this end, the generator includes a voltage sharing circuit (80) which has a first variable resistor ($R_1'$) with higher resistance as a load element and a second variable resistor ($R_2'$) with lower resistance as a driving element. As the temperature increases, the resistance of the first variable resistor ($R_1'$) increases, thereby decreasing the current flow formed therethrough. Then, the comparator (60) connected to the output of the voltage sharing circuit (80) allows the output circuit (70) to increase the internal supply voltage, in response to increase of the temperature.

11 Claims, 5 Drawing Sheets

| CONDUCTION TYPE | WIDTH/LENGTH OF CHANNEL | 25°C | 85°C | CURRENT DECREASE RATIO |
|---|---|---|---|---|
| NMOS | 50/50 [μm] | 436.4 [μA] | 327.2 [μA] | 25.0 % |
| | 10/1.1 | 2.50 [MA] | 2.19 [MA] | 12.3 % |
| PMOS | 50/50 | −120.4 [μA] | −101.8 [μA] | 15.4 % |
| | 10/1.3 | −942.7 [μA] | −857.1 [μA] | 9.1 % |

FIG. 7

CIRCUIT FOR GENERATING INTERNAL SUPPLY VOLTAGE

BACKGROUND OF THE INVENTION

The present invention relates to a circuit for generating internal supply voltage for use in a high density semiconductor memory device. In particular, the present invention relates to a circuit for generating internal supply voltage wherein the output voltage generated therefrom increases in response to increase of the temperature.

At recent, in a semiconductor memory device with high memory capacity, it is required to supply a metal oxide silicon (hereafter referred to as MOS) transistor below a micron unit level with low supply voltage lower than the external supply voltage of 5 V which is generally supplied in computer systems. For this end, an internal supply voltage generator must be prepared in semiconductor chips in addition to a memory circuit so as to supply the low internal supply voltage. For instance, a semiconductor dynamic random access memory (hereinafter referred to as "DRAM" device over 16 Mbit level necessarily includes the internal supply voltage generator in order to obtain a high reliability of the memory device.

A prior art internal supply voltage generator and the characteristics thereof are well disclosed with reference to FIGS. 1 to 3. Referring to FIG. 1, the conventional internal supply voltage generator 100 includes of a reference voltage generator 50, a comparator 60 and an output circuit 70. Shown in FIG. 2 are the characteristics of the internal supply voltage generator of FIG. 1, in comparison with the external supply voltage. Furthermore, another embodiment of the reference voltage generator 50 of FIG. 1 is described in FIG. 3.

Referring again to FIG. 1, the internal supply voltage generator 100 has the reference voltage generator 50 and the output circuit 70 which includes a p-channel metal oxide semiconductor (hereinafter referred to as "PMOS") transistor 10 serving as a variable resistor. The voltage output from the reference voltage generator 50 and the output circuit 70 are then compared at the comparator 60 which is a differential amplifier for controlling the voltage applied to the gate of the PMOS transistor 10. The reference voltage generator 50 has first and second resistors $R_1$, $R_2$ connected in series between the external supply voltage and the ground level, to generate reference voltage $V_{ref}$ through a connection node 3. The comparator 60 has first and second NMOS transistors 6, 7 forming a differential amplifier, a third NMOS transistor 8 serving as a constant current source, and a first and second PMOS transistors 4, 5 forming a current mirror load stage. Moreover, the PMOS transistor 10 has the source connected to the external supply voltage $Vcc_{ext}$, and the drain connected to the internal supply voltage $Vcc_{int}$ of an output node 11. In the drawing, the reference voltage $V_{ref}$ is applied to the gate to the first NMOS transistor 6 of the comparator 60. In the event that the load current flow is formed from the output node 11 to memory circuit (not shown), a voltage drop occurs at the PMOS transistor 10 of the output circuit 70. As a result, the internal supply voltage is set to a voltage level lower than the external supply voltage. At the same moment, the comparator 60 controls the gate voltage of the PMOS transistor 10 so as to keep the internal supply voltage level identical to the reference voltage $V_{ref}$ level.

The internal supply voltage generator must keep a constant internal supply voltage regardless of the change of the external supply voltage in order to obtain high reliability of the semiconductor memory device. Undesirably, however, the conventional internal supply voltage generator 100 of FIG. 1 has the voltage difference $\Delta V$ as shown in FIG. 2, in response to the increase of the external supply voltage. The foregoing problem is caused by the fact that the reference voltage $V_{ref}$ from the reference voltage generator 50 is $$V_{ref} = \frac{R_2}{(R_1 + R_2)} Vcc_{ext};$$

therefore, the reference voltage $V_{ref}$ increases as the external supply voltage increases, thereby increasing the internal supply voltage. Accordingly, the reliability of the semiconductor may be reduced.

Referring to FIG. 3, the reference voltage generator 50 includes of a first to third PMOS transistors 12, 13, 14 connected in series to each other, and fourth and fifth PMOS transistors 15, 16 connected in series to each other, the first to third PMOS transistors being connected in parallel to the fourth and fifth PMOS transistors. The gates and drains of first to fifth PMOS transistors 12–16 each are diode-connected and, further, the gate of the fourth PMOS transistor 15 is connected to the source of the third PMOS transistor 14. The source of the third PMOS transistor 14 is coupled so as to set the gate voltage level of the fourth PMOS transistor 15 to $$\frac{Vcc_{ext}}{3},$$

the source of the fourth PMOS transistor 15 becoming an output node 17, by which the reference voltage generator 50 generates the reference voltage $V_{ref}$, through the output mode 17. As the temperature increases, however, the threshold voltage $V_{th}$ of the respective PMOS transistors in the reference voltage generator 50 shown in FIG. 3 is reduced. Therefore, the reference voltage $V_{ref}$ will also be reduced. If the reference voltage is reduced, the internal supply voltage will also be reduced, causing the semiconductor memory device to operate at a low speed.

SUMMARY OF THE INVENTION

It is accordingly an object of the present invention to provide a circuit for generating internal supply voltage which allows a semiconductor memory device to operate at a stable, constant speed regardless of the change of the temperature, wherein the output voltage thereof increases as the temperature increases.

In order to achieve the above and other objects and features of the invention, an inventive internal supply voltage generator includes a voltage sharing circuit which has a first and second variable load resistors connected in series between the internal supply voltage output and the ground level, a common connection of the variable load resistors becoming an output node thereof, in order to allow the internal supply voltage output to increase in response to increase of the temperature.

BRIEF DESCRIPTION OF THE PREFERRED EMBODIMENTS

For a better understanding of the invention and to show how the same may be carried into effect, reference will now be made, by way of example, to the accompanying diagrammatic drawings, in which:

FIG. 7 is a table for illustrating the decrease ratio of the current driving power of MOS transistors in response to change of the temperature.

DETAILED DESCRIPTION OF THE INVENTION

Figure 1:
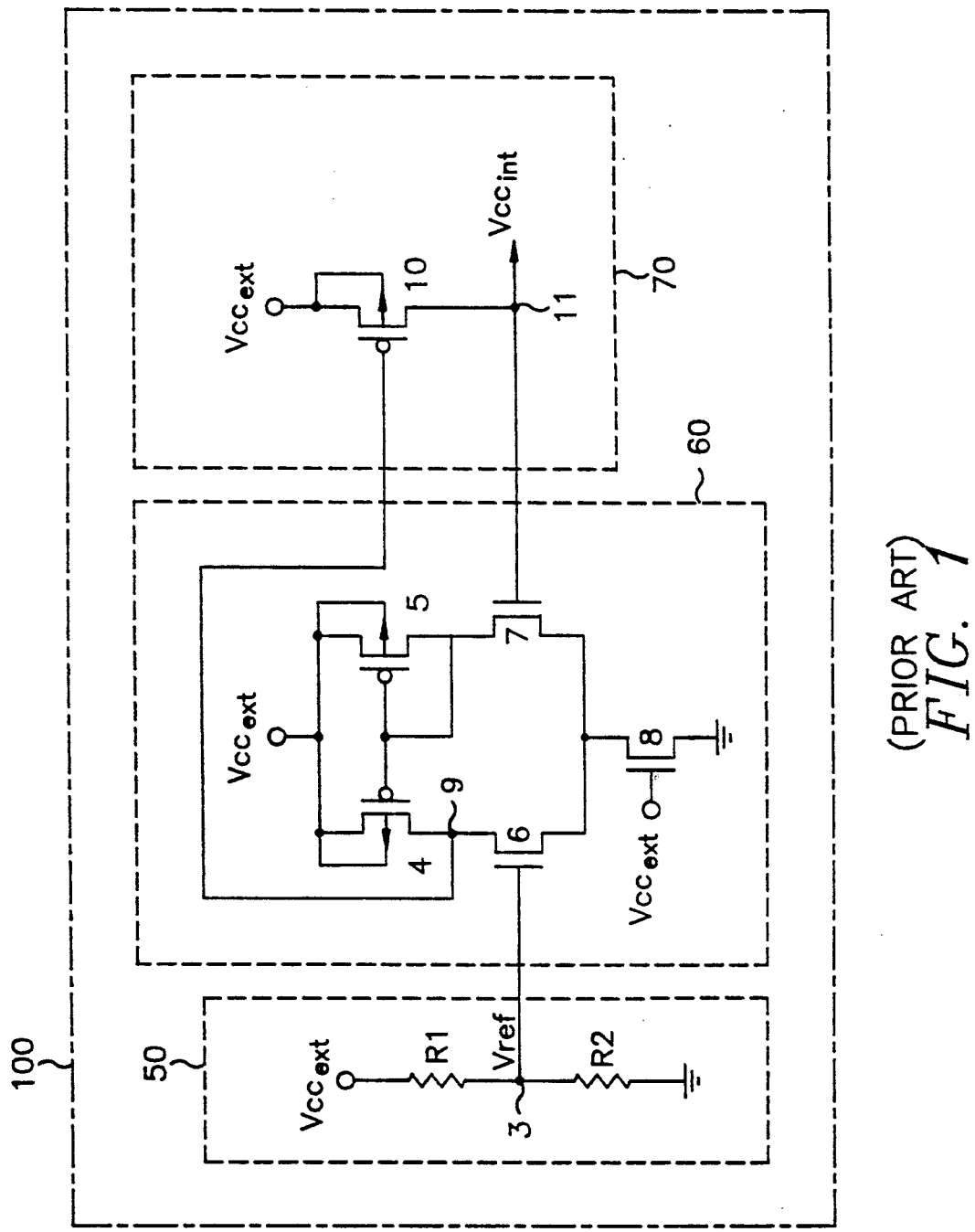
FIG. 1 shows a conventional internal supply voltage generator.
Figure 2:
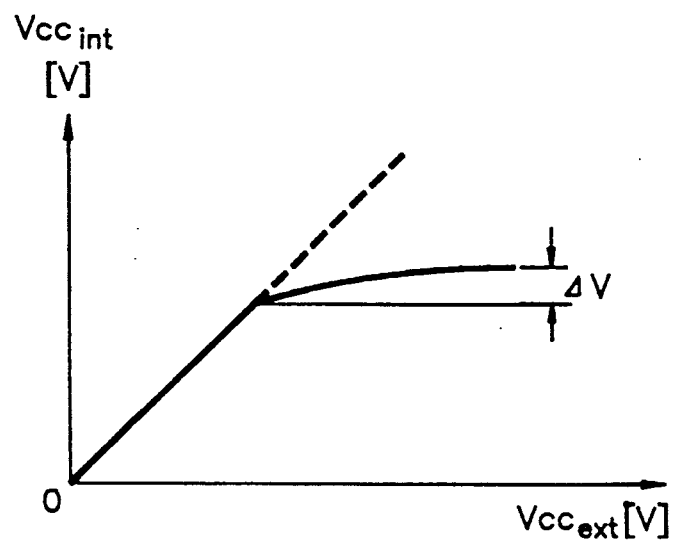
FIG. 2 shows the output characteristics of the internal supply voltage generator of FIG. 1.
Figure 3:
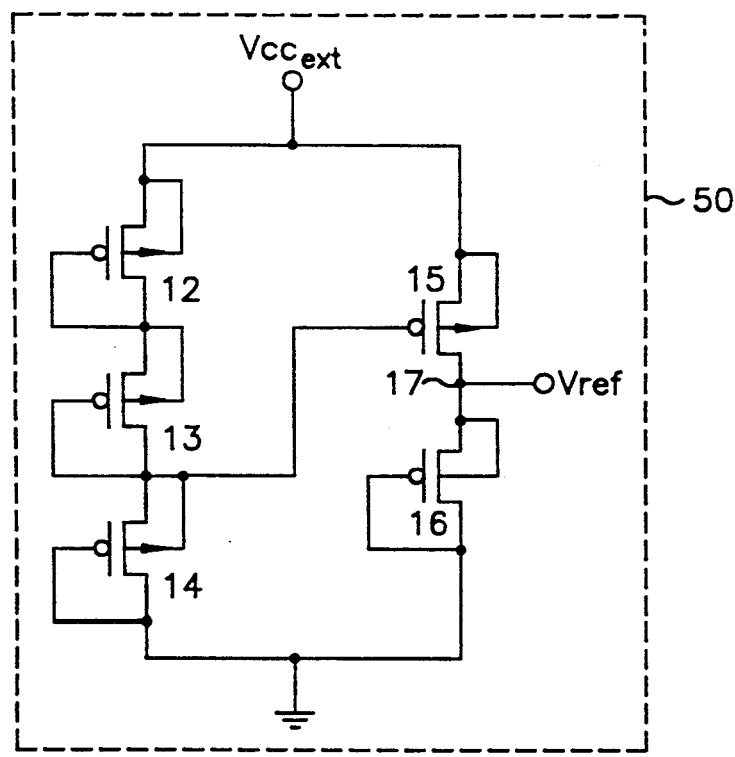
FIG. 3 shows another embodiment of the reference voltage generator of FIG. 1.
Figure 4:
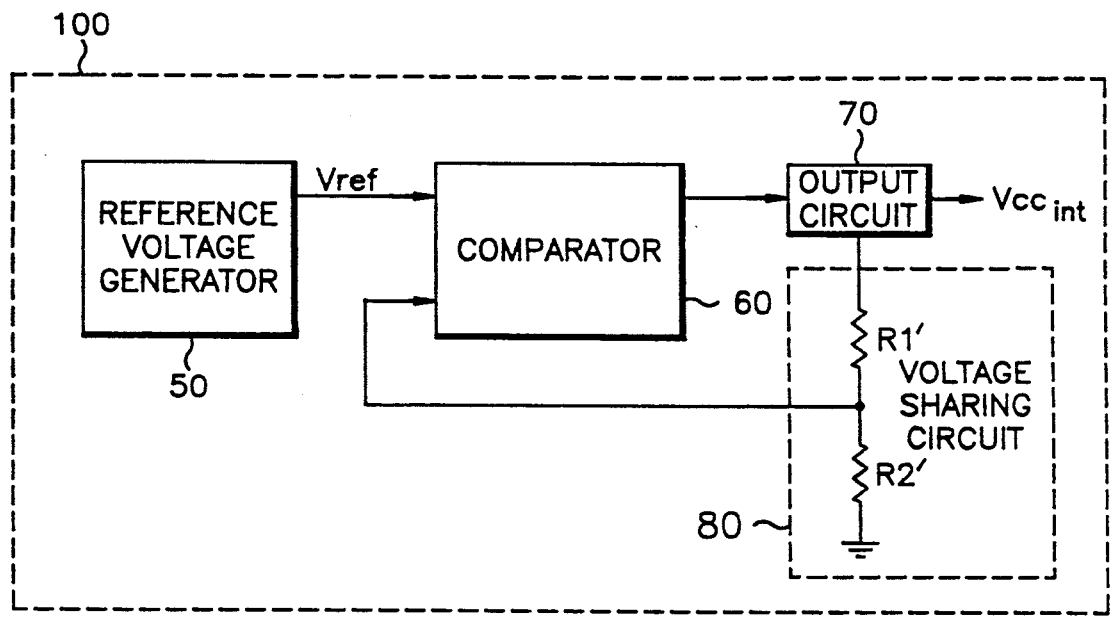
FIG. 4 shows an internal supply voltage generator according to the present invention.

Referring to FIG. 4, how a voltage sharing circuit 80 is connected to a comparator 60 and an output circuit 70 is well illustrated. A reference voltage generator 50 to which an external supply voltage is applied, generates a reference voltage $V_{ref}$. The comparator 60 connected to the output of the reference voltage generator 50, compares a first input voltage coupled to the reference voltage $V_{ref}$ with a second input voltage. The output of the comparator 60 is coupled to an input terminal of the output circuit 70 for generating internal supply voltage. The voltage sharing circuit 80, connected to the output circuit 70, generates the second input voltage at an output node thereof, thereby to allow the output voltage level of the output circuit 70 to increase in response to increase of the temperature. It should be further noted that the voltage sharing circuit 80 has a first and second variable load resistors $R_1'$, $R_2'$ of which resistances increase in response to increase of the temperature wherein resistance of the first variable load resistor $R_1'$ being higher than that of the second variable load resistor $R_2'$. Furthermore, the resistance increase ratio according to increase of the temperature, of the first variable load resistor $R_1'$ is higher than that of the second variable load resistor $R_2'$.

The output voltage $Vcc_{int}$ of the internal supply voltage generator 100 of FIG. 4, can be written as $$Vcc_{int} = \frac{1 + R_1'}{R_2'} \cdot V_{ref}$$

where the ratio of resistance variation to temperature change is $R_1' > R_2'$. It is therefore apparent from the foregoing that as the temperature increases, the resistance increase ratio of the first variable load resistor $R_1'$ becomes higher than that of the second variable load resistor $R_2'$, thereby increasing the internal supply voltage $Vcc_{int}$.

Figure 5:
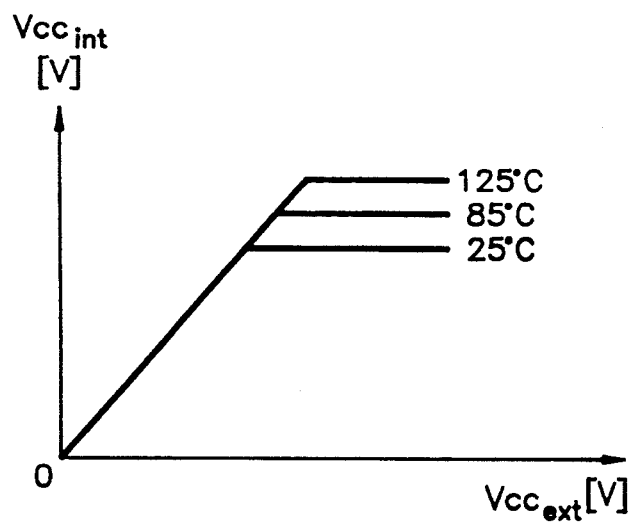
FIG. 5 shows the output characteristics of the internal supply voltage generator of FIG. 4.

As well illustrated with reference to FIG. 5, it is understood that the internal supply voltage $Vcc_{int}$ increases stably to keep it constant as the temperature increases. Accordingly, the problem found in the conventional circuits, that as the temperature increases, the reference voltage $V_{ref}$ of the reference voltage generator is reduced, resulting in the undesirably low internal supply voltage, as well as the problem that as the external supply voltage increases, the reference voltage also increases, resulting in the unstable internal supply voltage, are both solved out.

Figure 6:
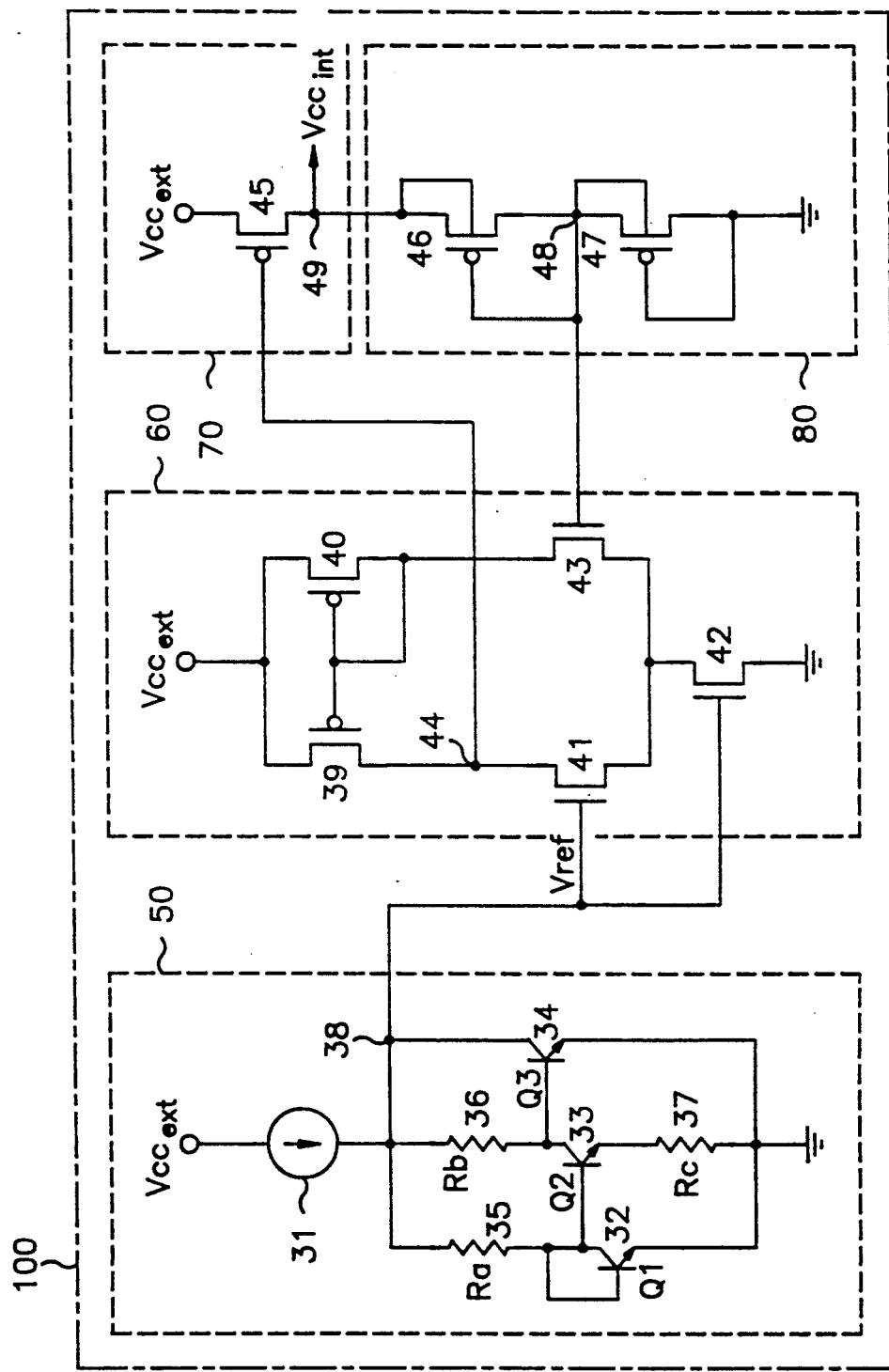
FIG. 6 shows an embodiment of the internal supply voltage generator of FIG. 4.

An embodiment of the internal supply voltage generator 50 of FIG. 4 will now be described in detail hereinbelow, with reference to FIG. 6. The reference voltage generator 50 has a constant current source 31 an input thereof being coupled to the external supply voltage $Vcc_{ext}$, an output node 38 being coupled to the output of the constant current source 31, and a circuit connected between the output node and the ground level, for dropping the voltage level of the output node 38 to a predetermined level.

The voltage dropping circuit has a first resistor 35 connected to the output node 38, another end of the first resistor 35 being commonly coupled to the collector and base of a first bipolar transistor 32 of which emitter is coupled to the ground level. A second resistor 36 an end thereof being coupled to the output node 38, is coupled to the collector of a second bipolar transistor 33 having the base coupled to the collector of the first bipolar transistor 32 and the emitter connected the ground level via a third resistor 37. Moreover, the output node 38 is connected to the collector of a third bipolar transistor 34 of which the base is connected to the collector of the second bipolar transistor 33 and the emitter is coupled to the ground level.

The comparator 60 has a first PMOS transistor 39 of which the source is connected to the external supply voltage, and a second PMOS transistor 40 of which the source is connected to the external supply voltage. The gate of the first PMOS transistor 39 is commonly connected to the gate and drain of the second PMOS transistor 40. Then, the gate of a first NMOS transistor 41 is coupled to a first input voltage, i.e., the reference voltage $V_{ref}$. Furthermore, the first NMOS transistor 41 has the drain connected to the train of the first PMOS transistor 39 and the source connected to the source of a second NMOS transistor 43 of which the drain is connected to the drain of the second PMOS transistor 40 and the gate is coupled to a second input voltage. The sources of the first and second NMOS transistors 41, 43 are connected to the drain of a third NMOS transistor 42 of which the source is connected to the ground level and the gate is coupled to he first input voltage. The connection node 44 of the drains of the first PMOS transistor 39 and the first NMOS transistor 41 serves as an output node of the comparator 60.

The output circuit 70 includes of a PMOS transistor with the source being connected to the external supply voltage $Vcc_{ext}$ and the gate being connected to the output node 44 of the comparator 60. The drain of the PMOS transistor 45 is connected to an output node 49 through which the internal supply voltage $Vcc_{int}$ is generated.

The voltage sharing circuit 80 includes of a first PMOS transistor 46 with the source being connected to the output node 49 of the output circuit 70, and the gate and drain being diode-connected. A second PMOS transistor 47 has the source connected to the drain of the first PMOS transistor 46, and the gate and drain diode-connected to the ground level. Moreover, an output node 48 to which the drain and source of the first and second PMOS transistors are respectively connected, is coupled to the second input voltage.

In order to generate a constant reference voltage $V_{ref}$ regardless of change of the temperature, the reference voltage generator 50 includes of bipolar transistors. For reference, the output voltage of the inventive reference voltage generator 50 is $$V_{ref} = V_{BE} + \frac{R_b}{R_c} \cdot V_t \cdot I_n\left(\frac{I_1}{I_2} \cdot \frac{I_{S2}}{I_{S1}}\right),$$

where $V_{BE}$ is base-emitter voltage of the third bipolar transistor 34; $V_t$ the thermoelectric voltage; $R_b$ and $R_c$ the second and third resistors 36, 37 respectively; and $I_{S1}$ and $I_{S2}$ the collector saturation current of the first and second bipolar transistors 32, 33 respectively. The reference voltage generator 50 is made such that the base-emitter voltage $V_{BE}$ with a negative temperature coefficient of $-2.2$ mV/°C. and the thermoelectric voltage $V_t$ with a positive temperature coefficient of $0.085$ mV/°C. are combined with each other so as to obtain a zero temperature coefficient. Therefore, unlike the conventional reference voltage generator using PMOS transistors having a negative temperature coefficient of $-3$ mV/°C., the inventive reference voltage generator 50 can generate a stable, constant reference voltage $V_{ref}$, regardless of change of the temperature.

Besides, the voltage sharing circuit 80 is so connected to increase the reference voltage $V_{ref}$, to thereby increase the internal supply voltage $Vcc_{int}$ according to increase of the temperature. For this end, the channel conductance $$g_1\left(=\frac{\partial I_{DS}}{\partial V_{DS}}\right)$$

of the first PMOS transistor 46 is made lower than the channel conductance $g_2$ of the second PMOS transistor 47; therefore, the channel resistance of the first PMOS transistor 46 is higher than that of the second PMOS transistor 47. It is known that the conductance is a reciprocal of the resistance. From the foregoing, it can be understood that the current driving power is reduced for a MOS transistor with a high channel resistance. In general, a MOS transistor with a long channel length is under greater influence of the temperature than a MOS transistor with a short MOS transistor; therefore, variation of the channel resistance according to the temperature, of the MOS transistor with a long channel length is comparatively considerable.

The internal supply voltage generator of FIG. 6 operating at the normal temperature of 25° C. will now be considered hereinbelow. The reference voltage $V_{ref}$ from the reference voltage generator 50 is applied to the gates of the first and third NMOS transistors 41, 42. At this moment, if this voltage is higher than the voltage applied to the gate of the second NMOS transistor 43 of the comparator 60, a given voltage will be charged at the output node 49 of the output circuit 70. In the meantime, in the case where the reference voltage $V_{ref}$ is at the same level as the output voltage of the voltage sharing circuit 80, the internal supply voltage $Vcc_{int}$ is maintained constant by the voltage sharing circuit 80. In a little while, if the temperature is increased up to over 83° C., the current flow in the first PMOS transistor 46 of the voltage sharing circuit 80 will be reduced; therefore, a voltage lower than that during the normal temperature is applied to the gate of the second NMOS transistor 43 of the comparator 60. Thus, a voltage at the output node 44 of the comparator 60 is charged to be lower than that during the normal temperature and, thereby, a voltage at the output node 49, i.e., the internal supply voltage $Vcc_{int}$, of the output circuit 70 will be increased. Furthermore, as the temperature increases more and more, the current flow formed at the channel of the first PMOS transistor 46 of the voltage sharing circuit 80 is reduced more and more, so that the internal supply voltage of the output node 49 of the output circuit 70 increases with reference to increase of the temperature. As a result, since the deterioration of MOS transistor due to variation of the temperature is prevented, it can be possible to have a semiconductor memory device operating stably.

For a better understanding of the voltage sharing circuit 80 according to the present invention, a table in FIG. 7 will be described hereinbelow, wherein the current driving power decrease ratio is shown in detail for MOS transistors with the gate oxide layer thereof being 160 Å thick. In the following, as a matter of convenience, the PMOS transistor will be described together with the NMOS transistor; however, the matters related to the PMOS transistor are described in a parenthesis. In the table, the current driving power for the NMOS (PMOS) transistor is measured under the condition that the gate and drain voltages applied thereto are both $+4.0$ V ($-4.0$ V), and the substrate-source voltage is $-2.0$ V (0 V). The current driving power decrease ratio at 85° C. is illustrated in comparison with the current driving power decrease ratio at 25° C. It will be understood to a person skilled in the art that the high decrease ratio of the current driving power means the high increase ratio of the channel resistance in response to increase of the temperature, of the MOS transistor. Accordingly, as the channel conductance of the MOS transistor is made low, the channel resistance thereof is high and, thus, the resistance increase ratio thereof is also high.

From the foregoing descriptions, it is understood that the inventive internal supply voltage generator can compensate for the decrease of the current driving power due to increase of the temperature as well as for the decrease of the operational speed thereof due to the decrease of the current driving power. Therefore, the semiconductor memory device employing the inventive circuit can be operated stably regardless of the variation of the temperature.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. An internal voltage generating circuit having a comparator for generating internal supply voltage at an internal power supply terminal of a memory device by comparing a reference voltage with a feedback voltage, said circuit comprising:
   voltage sharing means coupled to receive said internal supply voltage at said internal power supply terminal, for increasing said internal supply voltage in response to increase of temperature of said memory device by variably increasing resistance to lower voltage of said feedback voltage, said voltage sharing means comprising:

first and second variable resistor means coupled in series to each other to form an output node between said first and second variable resistor means to generate said feedback voltage, and interposed between said power supply terminal and ground, said first and second variable resistor means further having a channel resistance ratio increasing in response to the increase of temperature of said memory device, wherein said channel resistance ratio provides a channel resistance of said first variable resistor means higher than a channel resistance of said second variable resistor means.

2. A circuit as claimed in claim 1, wherein said first and second variable resistor means comprises:

a first metal-oxide semiconductor transistor having a source coupled to said internal power supply terminal, and a drain and a gate diode-connected to said output node;

a second metal-oxide semiconductor transistor having a source coupled to said output node, a drain and a gate diode-connected to ground; and said first metal-oxide semiconductor transistor having a channel longer in length than said second metal-oxide semiconductor transistor.

3. A circuit receiving an external supply voltage, for generating an internal supply voltage lower than the external supply voltage, for use in semiconductor memory device, comprising:

reference voltage generator means connected to receive said external voltage, for generating a reference voltage;

comparator means having first and second input terminals respectively coupled to receive said reference voltage and a feedback voltage, for comparing voltages applied at said first and second input terminals to generate an intermediate voltage;

output means coupled to receive said intermediate voltage, for generating said internal supply voltage in dependence upon said intermediate voltage; and voltage sharing means coupled to receive said internal supply voltage, for providing said feedback voltage, whereby decreases in said feedback voltage enable said internal supply voltage to increase in response to increase in temperature of said semiconductor memory device.

4. A circuit as claimed in claim 3, wherein said reference voltage generator means comprises:

a first resistor having an end connected to an output node of said reference voltage generator means;

a first bipolar transistor having a collector and a base commonly connected to another end of said first resistor, and an emitter coupled to ground;

a second resistor having an end connected to the output node of said reference voltage generator means;

a second bipolar transistor having a collector coupled to another end of said second resistor, a base coupled to the collector of said first bipolar transistor, and an emitter coupled to ground via a third resistor; and a third bipolar transistor having a collector coupled to the output node of said reference voltage generator means, a base coupled to the collector of said second bipolar transistor, and an emitter coupled to ground.

5. A circuit as claimed in claim 3, wherein said comparator means comprises:

a first p-channel metal oxide semiconductor transistor having a source coupled to said external supply voltage;

a second p-channel metal oxide semiconductor transistor having a source coupled to said external supply voltage, and a gate and a drain commonly coupled to the gate of said first p-channel metal oxide semiconductor transistor;

a first N-type metal oxide semiconductor transistor having a gate coupled to receive said reference voltage, and a drain coupled to the drain of said first PMOS transistor;

a second N-type metal oxide semiconductor transistor having a gate coupled to receive the feedback voltage, and a drain coupled to the drain of said second p-channel metal oxide semiconductor transistor;

a third N-type metal oxide semiconductor transistor having a gate coupled to receive the reference voltage, a source connected to ground, and a drain coupled to the sources of said first and second N-type metal oxide semiconductor transistors; and an output node formed at a connection of the drains of said first p-channel metal oxide semiconductor transistor and said first N-type metal oxide semiconductor transistor, for providing said intermediate voltage.

6. A circuit as claimed in claim 3, wherein said output means comprises:

a p-channel metal oxide semiconductor transistor having a source coupled to the external supply voltage, a gate coupled to the output node of said comparator means; and an output node coupled to a drain of said p-channel metal oxide semiconductor transistor, for providing said internal supply voltage for said semiconductor memory device.

7. A circuit as claimed in claim 6, wherein said voltage sharing means comprises:

a first p-channel metal oxide semiconductor transistor having a source coupled to the output node of said output means, and a gate and a drain diode-connected;

a second p-channel metal oxide semiconductor transistor having a source coupled to the drain of said first p-channel metal oxide semiconductor transistor, and a gate and a drain diode-connected to ground; and an output node formed at a common connection of said first and second p-channel metal oxide semiconductor transistors, for providing said feedback voltage to said second input terminal of said comparator means.

8. A circuit for supplying internal voltage for a semiconductor memory device, comprising:

reference voltage generator means for generating a reference voltage in dependence upon an external voltage source, said reference voltage being substantially constant and independent of temperature variations;

comparator means for comparing said reference voltage with a feedback voltage to provide an intermediate voltage;

output means for providing said internal voltage for said semiconductor memory device in dependence upon said intermediate voltage; and voltage divider means coupled to receive said internal voltage, for changing said internal voltage in dependence upon temperature variations of said semiconductor memory device by generating said feedback voltage to said comparator means, said feedback voltage being inversely varied with said temperature variations, said voltage divider means comprising:

a first metal oxide semiconductor transistor having a source coupled to receive said internal voltage; and a second metal oxide semiconductor transistor having a drain and a gate connected to ground, and a source connected to a gate and a drain of said first metal oxide semiconductor transistor forming an output node for generating said feedback voltage, said first metal oxide semiconductor transistor further having a greater channel resistance value than said second metal oxide semiconductor transistor.

9. The circuit as claimed in claim 8, wherein said reference voltage generator means comprises:

power supply means for providing said external power voltage to an output node; and reference means for transforming said external power voltage into said reference voltage at said output node, said reference means comprising:

a first resistor having an end connected to an output node;

a first bipolar transistor having a collector and a base commonly connected to another end of said first resistor, and an emitter coupled to ground;

a second resistor having an end connected to said output node;

a third resistor;

a second bipolar transistor having a collector coupled to another end of said second resistor, a base coupled to the collector of said first bipolar transistor, and an emitter coupled to ground via said third resistor; and a third bipolar transistor having a collector coupled to said output node, a base coupled to the collector of said second bipolar transistor, and an emitter coupled to ground.

10. The circuit as claimed in claim 8, wherein said comparator means comprises:

a first p-channel metal oxide semiconductor transistor having a source coupled to said external supply voltage;

a second p-channel metal oxide semiconductor transistor having a source coupled to said external supply voltage, a gate and a drain commonly coupled to the gate of said first p-channel metal oxide semiconductor transistor;

a first N-type metal oxide semiconductor transistor having a gate coupled to receive said reference voltage, and a drain coupled to the drain of said first p-channel metal oxide semiconductor transistor;

a second N-type metal oxide semiconductor transistor having a gate coupled to receive the feedback voltage, and a drain coupled to the drain of said second p-channel metal oxide semiconductor transistor;

a third N-type metal oxide semiconductor transistor having a gate coupled to receive the reference voltage, a source connected to ground, and a drain coupled to said source of said first N-type metal oxide semiconductor transistor and to said source of said second N-type metal oxide semiconductor transistor; and an output node formed at a junction between said drain of said first p-channel metal oxide semiconductor transistor and said drain of said first N-type metal oxide semiconductor transistor, for providing said intermediate voltage.

11. The circuit as claimed in claim 8, wherein said first and second metal oxide semiconductor transistors are p-channel metal oxide semiconductor transistors.

* * * * *

UNITED STATES PATENT AND TRADEMARK OFFICE
CERTIFICATE OF CORRECTION

PATENT NO. : 5,146,152
DATED : September 8, 1992
INVENTOR(S) : Dae-Je CHIN, Jun-Young JEON It is certified that error appears in the above-indentified patent and that said Letters Patent is hereby corrected as shown below:

TITLE PAGE

Item, [75] Inventors' names:

change "Tae-Je Jin" to --Dae-Je Chin;

change "Joon-Young Jeon" to --Jun-Young Jeon--:

Column 4, line 52, delete "of" preceding "a PMOS";

Line 59, delete "of" preceding "a first PMOS"

Column 5, line 3, delete "of" preceding "bipolar";

Signed and Sealed this

Twenty-seventh Day of June, 1995

Attest:

BRUCE LEHMAN

Attesting Officer     Commissioner of Patents and Trademarks